(12) United States Patent
Wan (10) Patent No.: US 7,456,459 B2
(45) Date of Patent: Nov. 25, 2008

(54) DESIGN OF LOW INDUCTANCE EMBEDDED CAPACITOR LAYER CONNECTIONS

(75) Inventor: Lixi Wan, Tucker, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 11/516,377

(22) Filed: Sep. 6, 2006

(65) Prior Publication Data

US 2007/0108552 A1    May 17, 2007

Related U.S. Application Data

(60) Provisional application No. 60/729,272, filed on Oct. 21, 2005.

(51) Int. Cl.
| | |
|---|---|
| H01L 27/108 | (2006.01) |
| H01L 29/76 | (2006.01) |
| H01L 29/94 | (2006.01) |
| H01L 31/119 | (2006.01) |
| H01L 29/04 | (2006.01) |
| H01L 29/12 | (2006.01) |
| H01L 31/036 | (2006.01) |
| H01L 31/112 | (2006.01) |
| H01L 29/786 | (2006.01) |
| H01L 29/80 | (2006.01) |
| H01L 29/00 | (2006.01) |

(52) U.S. Cl. .................. 257/296; 257/68; 257/71; 257/277; 257/297; 257/298; 257/299; 257/300; 257/301; 257/302; 257/303; 257/304; 257/305; 257/306; 257/307; 257/308; 257/309; 257/310; 257/311; 257/312; 257/313; 257/532; 257/535; 257/908

(58) Field of Classification Search .................. 257/68, 257/71, 277, 296–313, 532, 535, 908
See application file for complete search history.

(56) References Cited

U.S. PATENT DOCUMENTS

| | | | |
|---|---|---|---|
| 5,010,641 | A | 4/1991 | Sisler |
| 5,079,069 | A | 1/1992 | Howard et al. |
| 5,155,655 | A | 10/1992 | Howard et al. |
| 5,161,086 | A | 11/1992 | Howard et al. |
| 5,162,977 | A | 11/1992 | Paurus et al. |
| 5,428,499 | A | 6/1995 | Szerlip et al. |
| 5,469,324 | A | 11/1995 | Henderson et al. |
| 5,504,993 | A | 4/1996 | Szerlip et al. |
| 5,870,274 | A | 2/1999 | Lucas |
| 6,140,693 | A | 10/2000 | Weng et al. |

(Continued)

OTHER PUBLICATIONS

U.S. Appl. No. 10/801,326, filed Mar. 16, 2004, Borland et al.

*Primary Examiner*—Ida M Soward (57) ABSTRACT

The present invention discloses capacitors having via connections and electrodes designed such that they provide a low inductance path, thus reducing needed capacitance, while enabling the use of embedded capacitors for power delivery and other uses. One embodiment of the present invention discloses a capacitor comprising the following: a top capacitor electrode and a bottom capacitor electrode, wherein the top electrode is smaller than the bottom electrode, comprising, on all sides of the capacitor; in an array, a multiplicity of vias located on all sides of the top and bottom capacitor electrodes, wherein the top electrode and the vias connecting to the top electrode act as an inner conductor, and the bottom electrode and the vias connecting to the bottom electrode act as an outer conductor.

10 Claims, 7 Drawing Sheets

U.S. PATENT DOCUMENTS

| | | |
|---|---|---|
| 6,214,445 B1 | 4/2001 | Kanbe et al. |
| 6,215,372 B1 | 4/2001 | Novak |
| 6,317,023 B1 | 11/2001 | Felten |
| 6,346,743 B1 | 2/2002 | Figueroa et al. |
| 6,404,615 B1 | 6/2002 | Wijeyesekera et al. |
| 6,407,929 B1 | 6/2002 | Hale et al. |
| 6,611,419 B1 | 8/2003 | Chakravorty |
| 6,908,809 B1 * | 6/2005 | Provo et al. .................. 438/239 |
| 2002/0008324 A1 * | 1/2002 | Shinkawata ................. 257/774 |
| 2002/0054471 A1 | 5/2002 | Adae-Amoakoh et al. |
| 2002/0134581 A1 | 9/2002 | Figueroa et al. |
| 2003/0075747 A1 | 4/2003 | Kim |
| 2004/0023361 A1 | 2/2004 | Galer et al. |
| 2004/0051131 A1 * | 3/2004 | Miyajima ................... 257/306 |
| 2004/0099999 A1 | 5/2004 | Borland |
| 2004/0121266 A1 | 6/2004 | Lee et al. |
| 2004/0212001 A1 | 10/2004 | Yamamoto |
| 2004/0233611 A1 | 11/2004 | Borland |
| 2006/0012966 A1 * | 1/2006 | Chakravorty ................ 361/763 |
| 2006/0197183 A1 * | 9/2006 | Yang et al. .................. 257/532 |

* cited by examiner

Capacitor Parameters with and without Vias

| Capacitor Type | Without Vias | | | With Vias | | |
|---|---|---|---|---|---|---|
| | Capacitance | ESR (Resistance) | Inductance | Capacitance | ESR (Resistance) | Inductance |
| Type A | 10.6nF | 7.9 mohms | 35.44pH | 15.3nF | 100 mohms | 218.2pH |
| Type B | 11nF | 10 mohms | 40pH | 13.26nF | 15.4 mohms | 115pH |
| Type C | 13.6nF | 8.9 mohms | 33.8pH | 13.2nF | 17.3 mohms | 79.4pH |

Type A  Type B  Type C

DESIGN OF LOW INDUCTANCE EMBEDDED CAPACITOR LAYER CONNECTIONS

CROSS-REFERENCE TO RELATED APPLICATION

This application claims priority to U.S. Provisional Application Ser. No. 60/729,272 filed in the United States Patent and Trademark Office on Oct. 21, 2005.

FIELD OF THE INVENTION

The present invention relates to the design of low inductance embedded capacitors in electronic integrated circuit (IC) packages. The capacitors have via connections and electrodes designed such that they provide a low inductance path, thus reducing needed capacitance, while enabling the use of embedded capacitors for charge supply, clean power delivery, and I/O connections to discrete and non-discrete embedded capacitors or capacitor layers.

TECHNICAL BACKGROUND

As semiconductor devices, including integrated circuits (IC), operate at higher frequencies, higher data rates, and lower voltages, the ability to limit noise in the power and ground (return) lines and supply sufficient current to accommodate faster circuit switching become increasingly important. In order to provide low noise, stable power to the IC, impedance in conventional circuits may be reduced by the use of additional surface mount technology (SMT) capacitors interconnected in parallel. The higher operating frequencies (higher IC switching speeds) mean that voltage response times to the IC must be faster. Lower operating voltages require that allowable voltage variations (ripple) and noise be reduced. For example, as a microprocessor IC switches and begins an operation, it calls for power to support the switching circuits. If the response time of the voltage supply is too slow, the microprocessor will experience a voltage drop or power droop that will exceed the allowable ripple voltage and noise margin and the IC will malfunction. Additionally, as the IC powers up, a slow response time will result in power overshoot. Power droop and overshoot must be controlled within allowable limits by the use of capacitors that are close enough to the IC so that they provide or absorb power within the appropriate response time.

SMT capacitors for impedance reduction and dampening power droop or overshoot are generally placed on the surface of the board or semiconductor package as close to the IC as possible to improve circuit performance. Conventional designs have capacitors surface mounted on a printed wiring board (PWB) or semiconductor package clustered around the IC. Large value capacitors are placed near the power supply, mid-range value capacitors at locations between the IC and the power supply and small value capacitors very near the IC. Large numbers of SMT capacitors, interconnected in parallel, are often required to reduce power system impedance requiring complex electrical routing. This leads to increased circuit loop inductance, which in turn increases impedance, constraining current flow, thereby reducing the beneficial effects of the surface mounted capacitors. As frequencies increase and operating voltages continue to drop, increased power must be supplied at faster rates requiring increasingly lower inductance and impedance levels.

Considerable effort has been expended to minimize impedance. U.S. Pat. No. 5,161,086 to Howard, et al., for example, provides one approach to minimizing impedance and "noise". Howard, et al. provides a capacitive printed circuit board with a capacitor laminate (planar capacitor) included within the multiple layers of the laminated board, a large number of devices such as integrated circuits being mounted or formed on the board and operatively coupled with the capacitor laminate (or multiple capacitor laminates) to provide a capacitive function employing borrowed or shared capacitance. However, such an approach does not necessarily improve voltage response. Improved voltage response requires that the capacitor is placed closer to the IC. However, simply placing the capacitor laminate closer to the IC may not be sufficient because the total capacitance available may be insufficient.

U.S. Pat. No. 6,611,419 to Chakravorty provides for an alternate approach to embedding capacitors to reduce switching noise wherein the power supply terminals of an integrated circuit die can be coupled to the respective terminals of at least one embedded capacitor in a multilayer ceramic substrate.

U.S. Provisional Patent Application Nos. 60/637,813, 60/637,813, and 60/637,817 provide for power supply cores for ICs, consisting of embedded discrete ceramic capacitors and planar capacitors. U.S. Provisional Patent Application No. 60/692,119 describes a discrete embedded ceramic capacitor design and method of making thereof whereby the screen-printed copper electrode completely encapsulates the screen-printed dielectric thus resulting in improved mechanical reliability and larger capacitor area compared to earlier designs.

The instant invention provides a novel low inductance capacitor and interconnect design utilizing the capacitor type described above, for interconnect to the IC thus reducing needed capacitance and enabling rapid charge supply and clean power supply to the IC from the embedded capacitors.

A primary major source of inductance of an embedded capacitor is related to the vias or wires or connection paths by which the capacitor connects to the system. A typical embedded capacitor without multiple vias has inductance ranging from hundreds of pico-henries to nano-henries. In certain applications, it can be so large that the first resonant frequency in the package impedance profile is forced into the low frequency range (<100 Mhz). Current connection designs for embedded capacitors are typically a pair of single vias, which connect to the electrodes separately. These vias can be located on any position of the electrode. The length of these vias is usually tens of micrometers for blind micro-vias to hundreds of micrometers for through hole via types. In certain situations, the inductance presented by the vias can be larger than the inductance presented by the capacitor; thus the vias become the major component in limiting the frequency response of the embedded capacitors. Therefore, reduction of the via inductance is critical to improving the performance of the capacitors.

To reduce the connection inductance, vias must be close to each other. Theoretically, the closer the vias are, the lower the inductance will be. However, since there must be a clearance between via landings due to capacitor designs and process limitations, the vias consequently have to be separated by a certain distance. These factors typically drive the inductance down below a hundred pico-henries, but further impedance reduction is desirable.

Embodiments of the invention described below provide improved capacitors for reducing total inductance in electronic IC packages and methods for making them.

SUMMARY OF THE INVENTION

One embodiment of the present invention discloses a capacitor comprising the following: a top capacitor electrode and a bottom capacitor electrode, wherein the top electrode is smaller than the bottom electrode, comprising, on all sides of the capacitor; in an array, a multiplicity of vias located on all sides of the top and bottom capacitor electrodes, wherein the top electrode and the vias connecting to the top electrode act as an inner conductor, and the bottom electrode and the vias connecting to the bottom electrode act as an outer conductor. The configuration makes the structure act as a capacitance loaded coaxial-like cable. In one embodiment of the capacitor described above, the number of vias located on all sides of the top and bottom capacitor electrodes is the maximum possible. The maximum possible may vary based on various factors including, the design, manufacturing processes, and equipment configuration. See FIG. 6, capacitor Type C for one embodiment.

The present invention further comprises a method of making a capacitor with via connections, wherein a metallic foil having a component side and a foil side is provided; the method comprising: forming a dielectric on the metallic foil; forming a first electrode over the entirety of the dielectric, and over a portion of the metallic foil; then laminating the component side of the metallic foil to at least one prepreg material, etching the metallic foil to form a second electrode, wherein the first electrode, the dielectric and the second electrode form a capacitor, wherein the device is laminated to at least one additional prepreg material after etching the metallic foil and wherein one or more vias are formed in the prepreg material connecting to the capacitor, the improvement is in the configuration of the said vias comprising: having a picture frame shape for an insulating trench between copper electrodes, wherein the trench is shaped so that it allows an array of outer electrode vias to surround an array of inner electrode vias. In the method described above said dielectric may be selected from the group comprising thick film dielectrics, thin film dielectrics, and combinations thereof.

Several embodiments of the present invention utilize the method described above wherein the insulating trench having a picture frame shape is in a shape selected from the group consisting of a square shape, a round shape, an oval shape, a rectangle shape and a polygon shape. In one embodiment, the trench width is as narrow as possible within the etch process capability. A further embodiment utilizes the methods above wherein the size of vias in the range of 1 to 500 microns.

Further embodiments are capacitors formed by the methods described above. Another embodiment is an embedded capacitor with a first electrode and a second electrode wherein said first and second electrode are coplanar electrodes and wherein said first and second electrodes are separated by a trench and wherein the first electrode fully surrounds the second electrode forming a coaxial-like structure. A further embodiment is a device comprising the embedded capacitor, as described above.

DETAILED DESCRIPTION OF THE INVENTION

This invention concerns a design configuration for the design of embedded capacitors which use a microvia and electrode design methodology to reduce the connection inductance to embedded capacitors. The structure resembles a coaxial cable structure's use of inductance distribution methodology terminated capacitance load. In a coaxial cable transmission line, one conductor is centered inside and insulated from an outer metal enclosure that services as a second conductor. A coaxial cable theoretically can provide the lowest distribution inductance among transmission lines.

Figure 1:
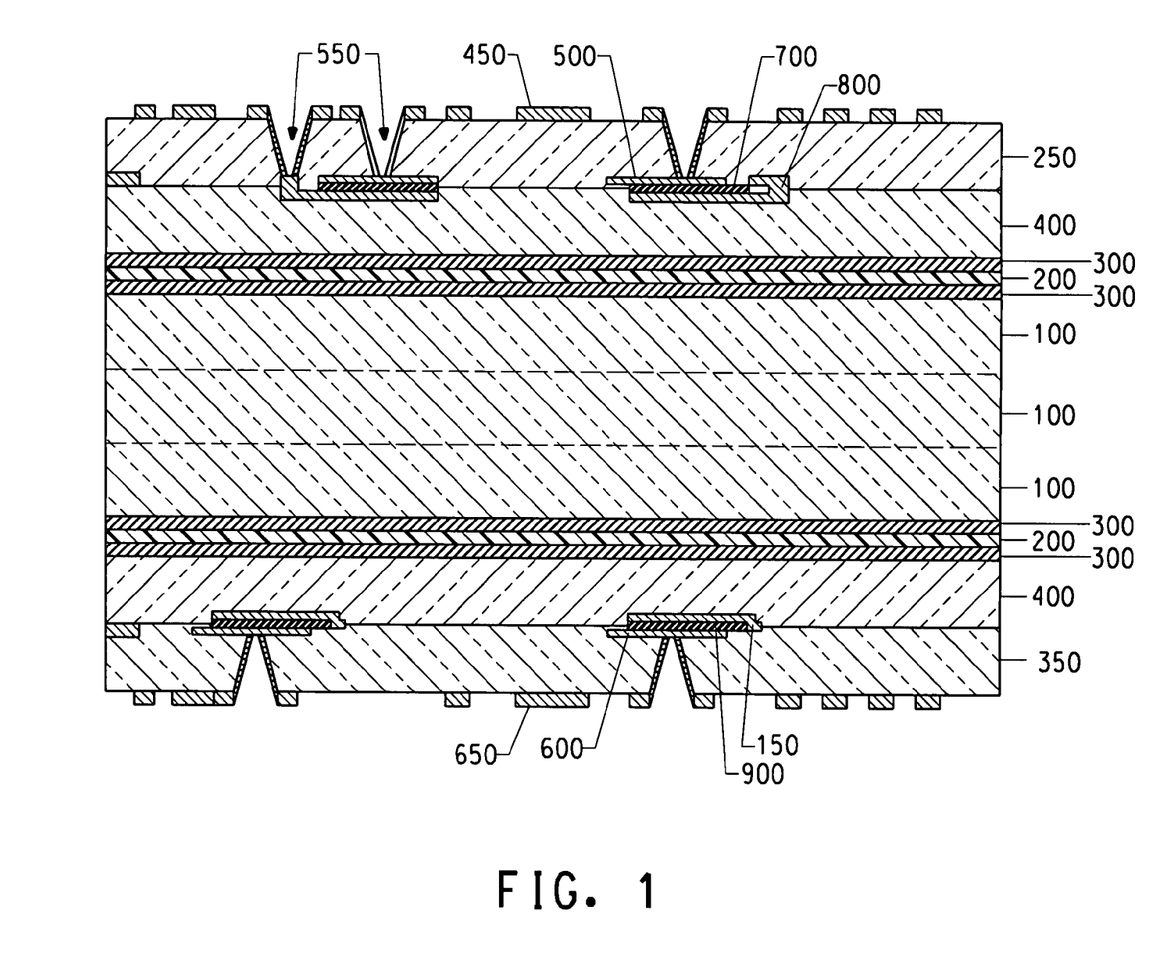
FIG. 1 is a stack-up of a package with embedded planar and discrete capacitors.
Figure 2:
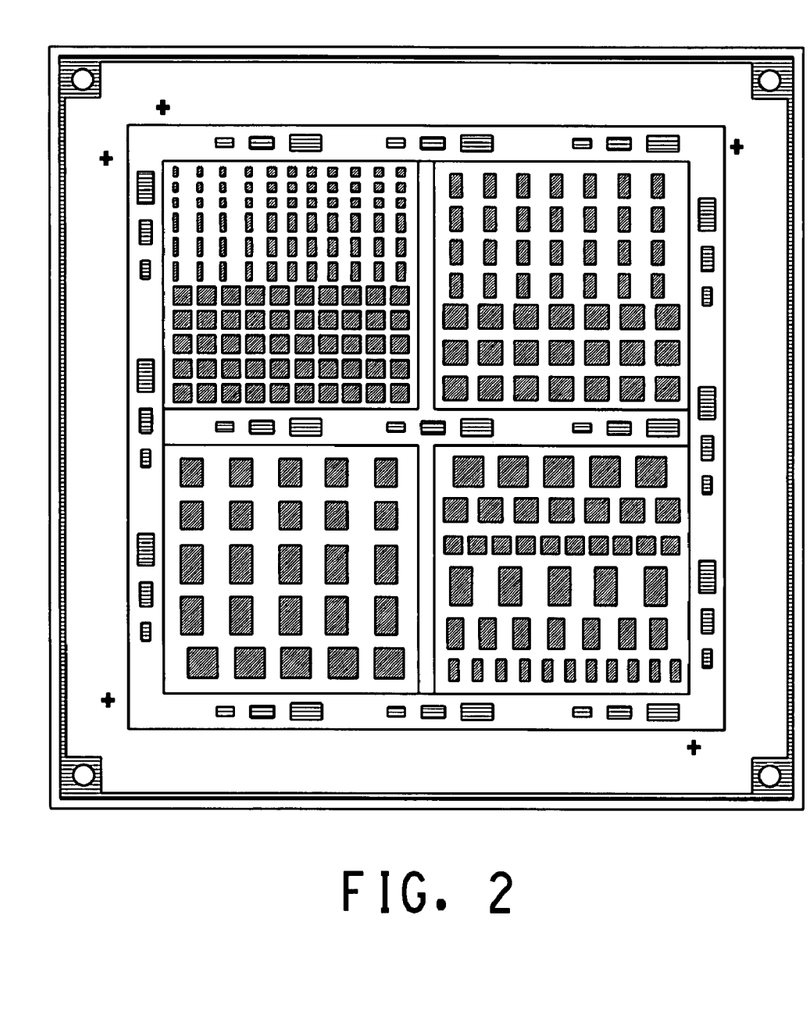
FIG. 2 is layout of an embedded capacitor array on copper foil

A package cross-section with embedded capacitor layers using these capacitors and via connections is described in FIG. 1. A possible discrete capacitor configuration is shown in FIG. 1. FIG. 2 shows an embedded capacitor array layout of different sizes and shapes typical of an embedded capacitor foil used in the fabrication of an electronic package. The present invention provides an embedded capacitor design with coplanar electrodes separated by a gap or trench where one electrode fully surrounds the other electrode forming a coaxial-like structure.

An array, as defined herein, is a "grouping or arrangement of elements." In the present invention, the elements are vias.

The devices (or packages) of the present invention may be selected from an interposer, printed wiring board, multichip module, area array package, system-on-package, system-in-package, and the like.

EXAMPLES

Fabrication of a Test Structure Containing Discrete Embedded Ceramic Capacitors (see FIG. 1).

Three 100 micron thick layers of BT (bismaleimide triazine) prepreg (B-stage resin on glass weave; type GHPL 830MG) from Mitsubishi Gas Chemical [100] were laminated to two planar capacitance laminates (DuPont Interra® HK11). The HK11 consisted of 14 μm thick, filled polyimide [200] with 35 μm copper foil on each side [300]. (Note: this test structure was a precursor to a more complex test vehicle in which the planar capacitor layers are connected to PTHs (plated throughholes) and additional microvia build-up layers (metal layers M1, M2, M13, and M14, not shown here) are added to the test structure). Discrete ceramic capacitors were formed on two copper foils (metal layers M4 [500] and M10 [600]) as described in U.S. Pat. No. 6,317,023. The foils were 35 μm thick copper, the dielectric composition [700, 900] was DuPont's EP310 (20 μm fired thickness), and the screen-printed copper electrode was 5 μm copper (metal layers M5 [800] and M11 [150]) (available from E. I. du Pont de Nemours and Company, Product No. EP320)". The metal foils M4 and M10 were then layed up with 100 μm BT prepreg [400] on either side of the structure containing the two planar capacitor layers and laminated. A multilayer bonding coating was then applied to metal layers M4 and M10. Metal layers M4 and M10 were then structured in a (subtractive) print & etch photo-lithographic process. BT prepreg (100 μm)[250, 350], capped with 3 μm copper foil [450, 650] was then laminated to the structure on both sides (metal layers M3 [450] and M12 [650]). Blind vias (microvias, 150 μm diameter) [550] were then drilled with a UV-laser through M3 and M12 and the underlying prepreg layers to connect to electrodes on metal layers M4 and M10. The microvia hole walls were then prepared by standard swell and (permanganate) etch chemistry, followed by electroless copper deposition. The patterning of metal Layers M3 and M12 and copper build-up in the microvias was accomplished by a semi-additive plating process (apply plating resist pattern, plate 12 μm copper, strip resist, differential etch of base copper).

Figure 3A:
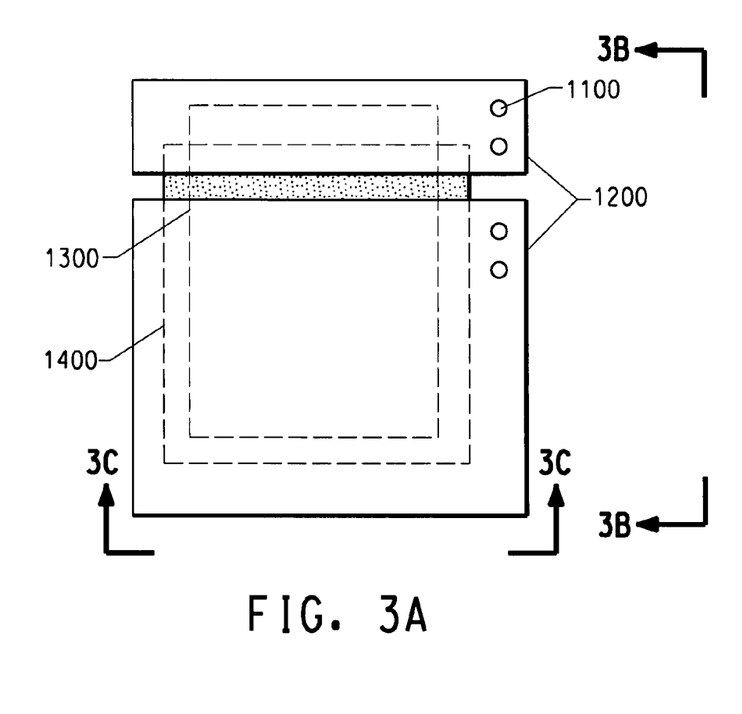
FIG. 3 is capacitor Type A.
Figure 3B:
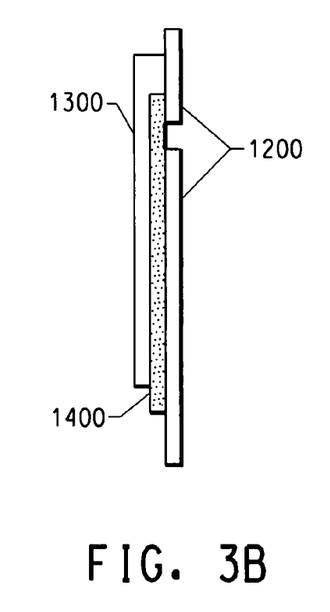
Figure 3C:
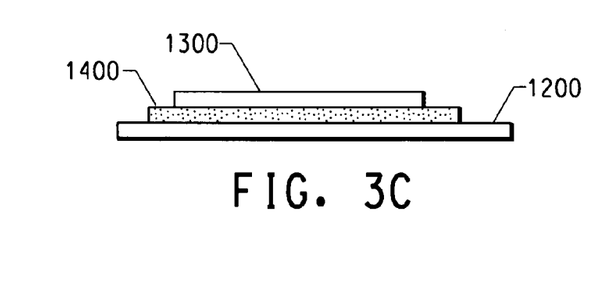
Figure 4A:
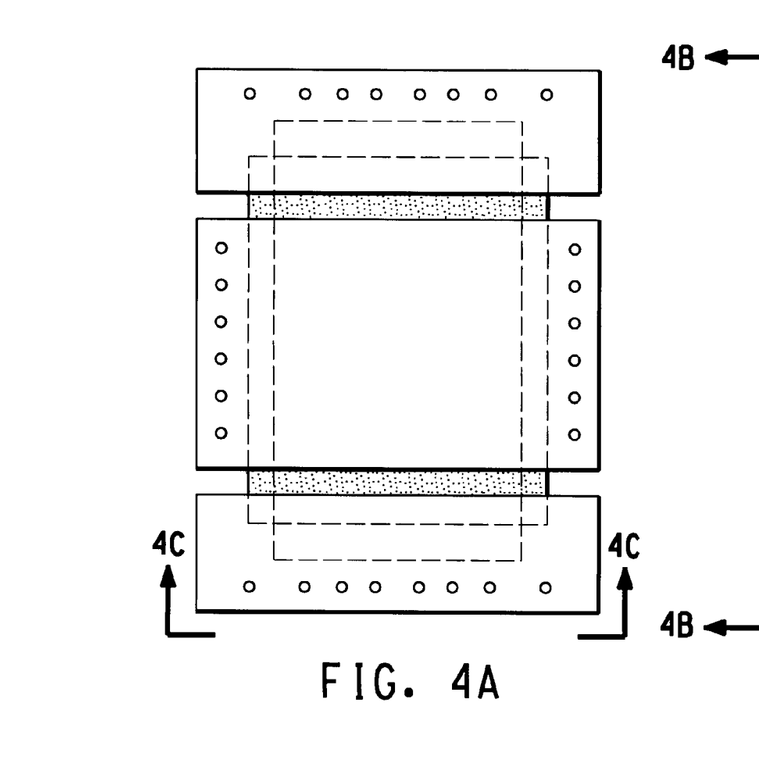
FIG. 4 is capacitor Type B.
Figure 4B:
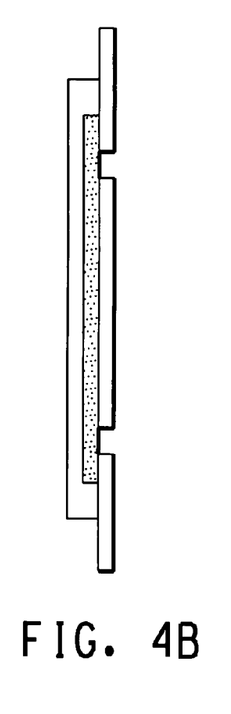
Figure 4C:
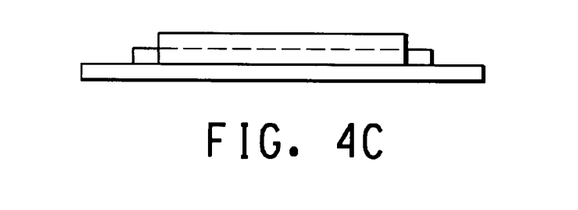
Figure 5A:
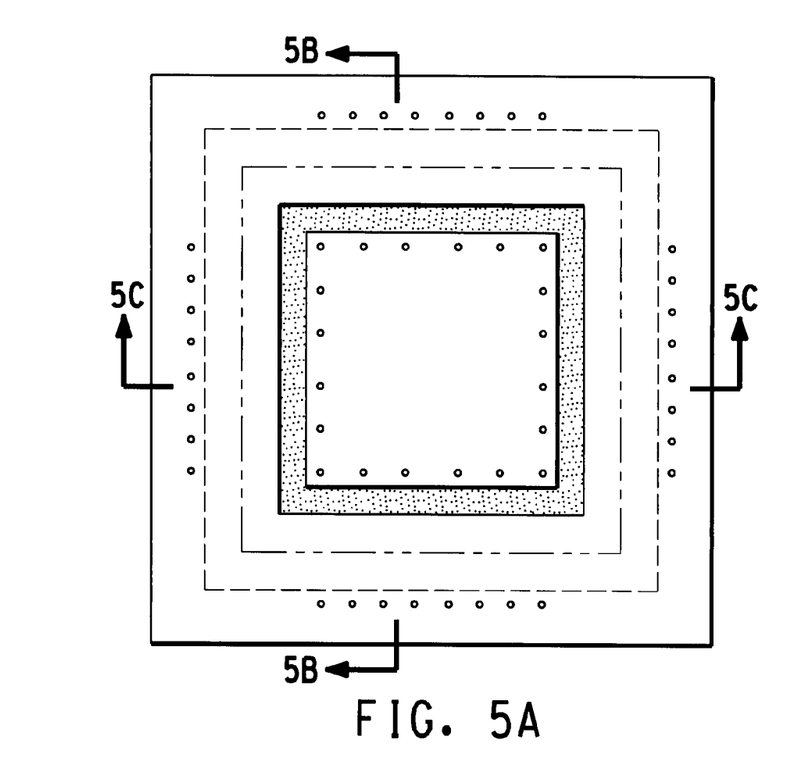
FIG. 5 is capacitor Type C.
Figure 5B:
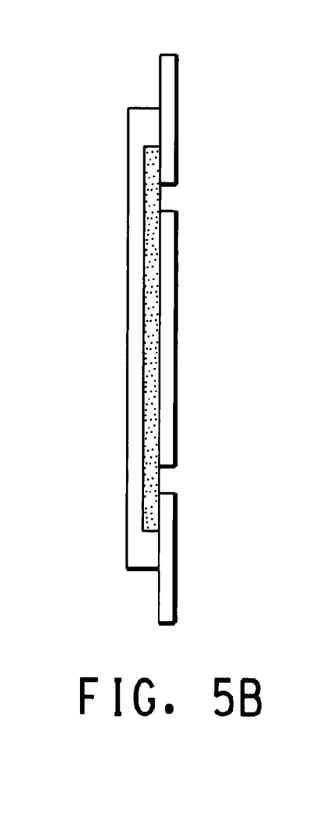
Figure 5C:
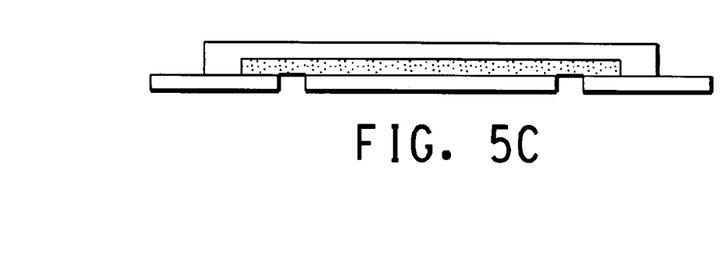

The lay-out of the embedded capacitors on metal layers M5 and M11 is shown in FIG. 2. There are three different capacitor designs: Type A (FIG. 3), Type B (FIG. 4), and Type C (FIG. 5). For each type, there are capacitors with 1 mm$^2$, 4 mm$^2$, and 9 mm$^2$ effective capacitor size (area). The capacitor designs differ in the relative position and size of the foil electrode [1200, 2200, 3200], the dielectric [1400, 2400, 3400], and the screenprinted copper electrode [1300, 2300, 3300]. They further differ in the design of the clearance (gap in the foil) that insulates the two copper electrodes, and they differ in location and number of vias [1100] that connect the embedded capacitor to the next metal layer above. For the 9 mm$^2$ size capacitor, Type A design features 4 via connections, Type B has 28 vias, and Type C has 52 vias.

RESULTS

Figure 6:
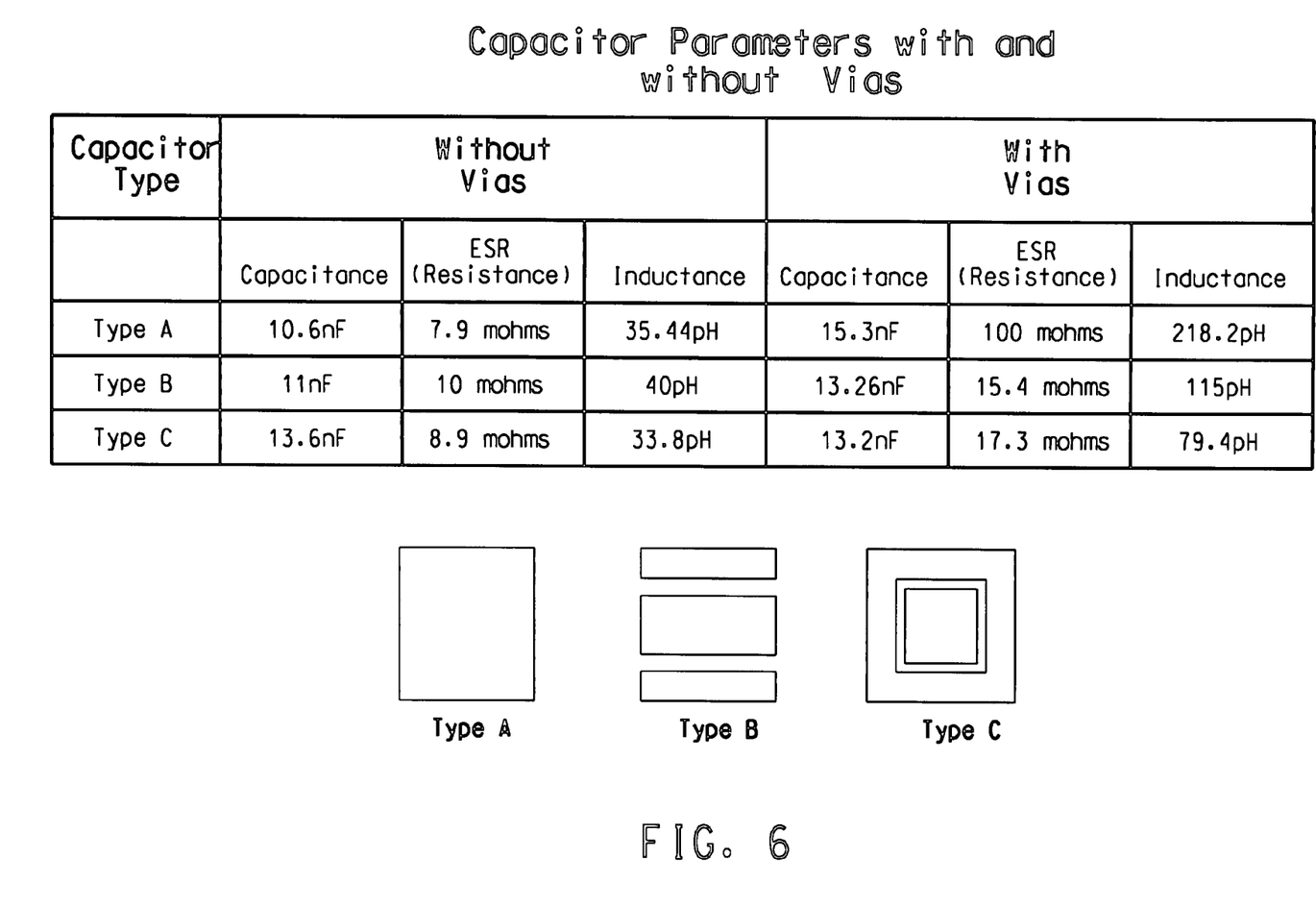
FIG. 6 describes capacitor parameters with and without vias.
Figure 7:
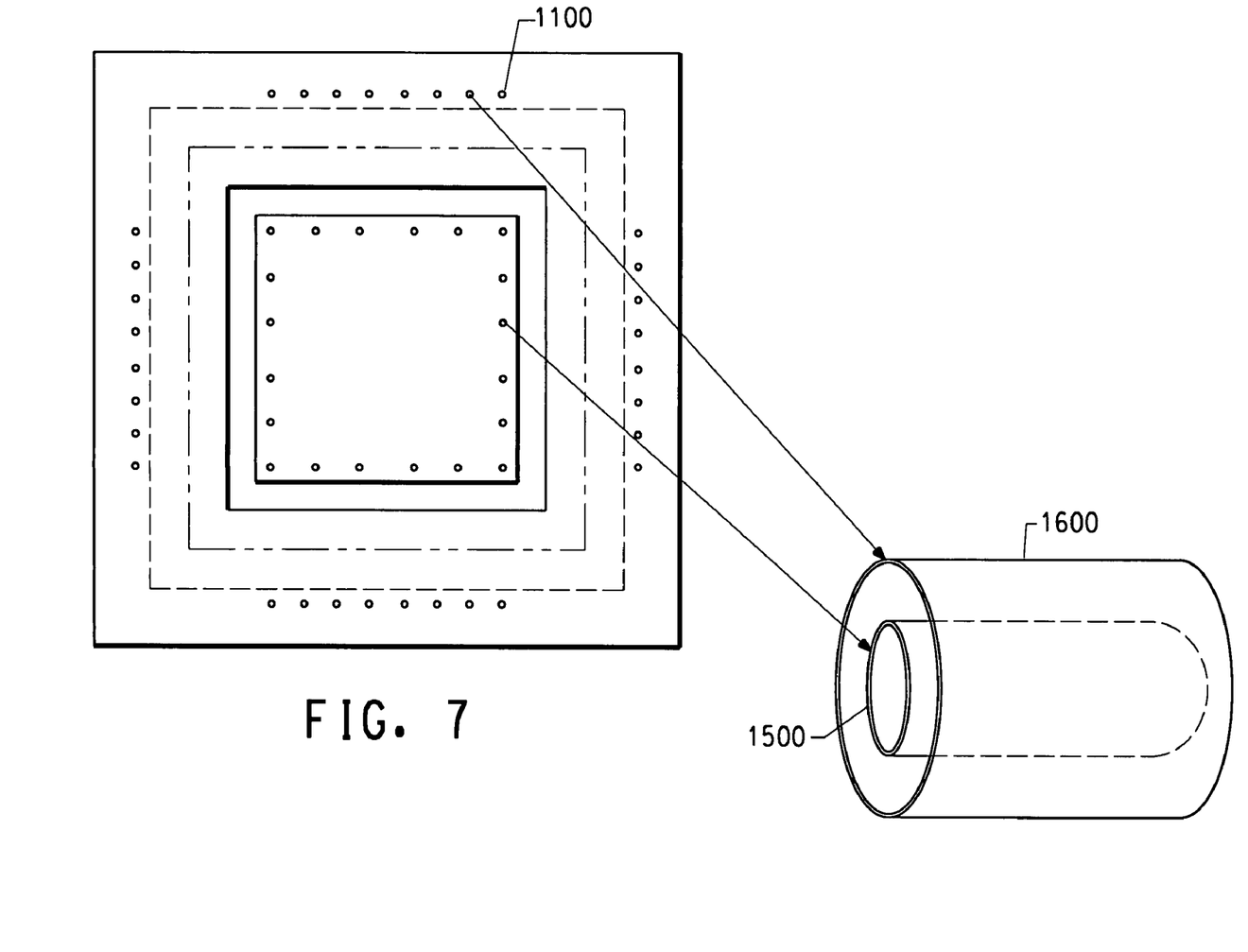
FIG. 7 shows a coaxial relationship for microvia arrays.

FIG. 6 summarizes the capacitance, resistance, and inductance measurements on 9 mm$^2$ size capacitors of Type A, B, and C, with and without via connections. It shows that capacitance, resistance, and inductance values of all three types, without via connections, are fairly similar. It also shows that resistance and inductance for capacitors of Type A, B, and C with via connections are very different from each other. This suggests that the number of vias and their location greatly affects the resistance and inductance of the capacitor. Furthermore, it shows that capacitor Type C with the via configuration shown in FIG. 5 has the lowest combined values for resistance and inductance which is very desirable. Thus, the array of via connections for capacitor Type C shown in FIG. 5 is one subject of this invention. It was not obvious that Type C capacitor with its particular electrode design and design of interconnect vias would yield the best results. Type C has a unique shape for the continous insulating trench between the copper electrodes (a "picture frame" islolating gap, e.g. square-shaped, rectangular, round, oval, or any polygon shape) that allows an outer electrode with an array of outer electrode vias to surround an inner electrode with an array of inner electrode vias. The electrodes and via arrays [1100] (see FIG. 7) are reminiscent of the construction of a coaxial cable with its conductive core [1500] and shield [1600], and the desirable electrical performance of the coaxial cable can be likened to that of the Type C capacitor and its via array. In the present invention, the via size ranges from 1 to 500 microns. In some embodiments, the via size ranges from 1-15, 15-250, and 15-500 microns, respectively.

What is claimed is:

1. A capacitor comprising the following:
   a top capacitor electrode, a dielectric layer, and a bottom capacitor electrode,
   said dielectric layer having a first side, an opposite second side, and at least one edge between said first and second sides of said dielectric layer,
   said top capacitor electrode covering a portion of the first side of the dielectric layer,
   said bottom capacitor electrode having a first section covering a portion of the first side of the dielectric layer, and having a second section covering a portion of the opposite second side of the dielectric layer, wherein said first and second sections of said bottom capacitor electrode interconnect along an edge of the dielectric layer,
   wherein the top capacitor electrode is smaller than the bottom capacitor electrode, the top capacitor electrode does not contact the bottom capacitor electrode, and the top capacitor electrode is coplanar with the first section of the bottom capacitor electrode, and the first section of the bottom capacitor electrode surrounds the top capacitor electrode and is separated from the top capacitor electrode by a trench,
   further comprising, on all sides of the capacitor, in an array, a multiplicity of vias connecting to the top capacitor electrode on all sides of the top capacitor electrode and a multiplicity of vias connecting to the first section of the bottom capacitor electrode on all sides of the bottom capacitor electrode, and wherein the top capacitor electrode and the vias connecting to the top capacitor electrode act as an inner conductor, and the bottom capacitor electrode and the vias connecting to the bottom capacitor electrode act as an outer conductor.

2. The capacitor of claim 1 wherein the number of vias located on all sides of the top and bottom capacitor electrodes is the maximum possible for a particular top and bottom capacitor electrode configuration.

3. The capacitor of claim 1 wherein the second section of the bottom electrode is formed over the entirety of the dielectric layer and over a portion of the first section of the bottom capacitor electrode.

4. The capacitor of claim 1 wherein the first section of the bottom capacitor electrode and the vias connecting to the bottom capacitor electrode surround the top capacitor electrode and the vias connecting to the top capacitor electrode, and a continuous insulating trench between the first section of the bottom capacitor electrode and the top electrode has a shape, when seen from a vantage point above the capacitor, that is similar to the shape of a picture frame.

5. The capacitor of claim 4 wherein the insulating trench having a picture frame shape is in a shape selected from the group consisting of a square shape, a round shape, an oval shape, a rectangle shape and a polygon shape.

6. The capacitor of claim 4 wherein the trench width is as narrow as possible within the etch process capability.

7. The capacitor of claim 1 wherein the top capacitor electrode and the first section of the bottom capacitor electrode are comprised of metallic foil.

8. The capacitor of claim 7 wherein the metallic foil of the top capacitor electrode and the first section of the bottom capacitor electrode is copper foil.

9. The capacitor of claim 7 wherein the capacitor is laminated to a prepreg material.

10. The capacitor of claim 9 wherein the vias connecting to the top capacitor electrode and the vias connecting to the bottom capacitor electrode are formed in the prepreg material.

* * * * *